(12) United States Patent
Huang et al.

(10) Patent No.: US 7,244,985 B2
(45) Date of Patent: Jul. 17, 2007

(54) NON-VOLATILE MEMORY ARRAY

(75) Inventors: Jie-Hau Huang, Taichung County (TW); Ching-Yuan Lin, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 54 days.

(21) Appl. No.: 11/164,174

(22) Filed: Nov. 14, 2005

(65) Prior Publication Data
US 2007/0063264 A1    Mar. 22, 2007

(51) Int. Cl.
H01L 29/788    (2006.01)
(52) U.S. Cl. .................. 257/315; 257/316; 257/390; 257/E27.081
(58) Field of Classification Search ........ 257/314–316, 257/319, 369, 390, 202, E27.081, E27.084
See application file for complete search history.

(56) References Cited

U.S. PATENT DOCUMENTS 5,710,072 A * 1/1998 Krautschneider et al. ... 438/197
6,392,636 B1 * 5/2002 Ferrari et al. ............... 345/173
6,812,574 B2 * 11/2004 Tomita et al. .............. 257/773
6,884,588 B1 * 4/2005 Rastogi et al. ................. 435/6
2006/0197145 A1 * 9/2006 Pittikoun et al. ........... 257/316

* cited by examiner

Primary Examiner—T. N. Quach
(74) Attorney, Agent, or Firm—Jianq Chyun IP Office

(57) ABSTRACT

A non-volatile memory array including memory units which are arranged in a row/column array is provided. Source lines are arranged in parallel in the column direction and connect to the source regions of the memory units in the same column. Bit lines are arranged in parallel in the row direction and connect to the drain regions of the memory units in the same row. Word lines are arranged in parallel in the column direction and connect to the select gates of the memory units in the same column. Control lines are arranged in parallel in the column direction and connect to the control gates of the memory units in the same column. The control lines are grouped into several groups with n control lines (n is a positive integer not less than 2) in one group, and the control lines in each group are electrically connected to each other.

24 Claims, 3 Drawing Sheets

NON-VOLATILE MEMORY ARRAY

BACKGROUND OF THE INVENTION

1. Field of Invention

The present invention relates to a semi-conductor device. More specifically, the present invention relates to a non-volatile memory array.

2. Description of Related Art

Among various types of non-volatile memory products, electrically erasable programmable read-only memory (EEPROM) is a memory device that has been widely used in personal computers and electronic equipment. Data can be stored, read out or erased form the EEPROM many times, and the stored data are retained in the memory even after power supplying the device is cut off.

Typical EEPROM includes a floating gate and a control gate fabricated by doped polysilicon. The non-volatile memory includes a dual-layer gate, which is hard to integrate with a regular CMOS logic process. In addition, because of the dual-layer gate, the manufacturing cost of the entire embedded non-volatile memory is high that results in less competitive in the market.

In addition, when the memory has been programmed, the electrons injected in a floating gate may be evenly distributed in the entire polysilicon floating gate layer. However, if defects exist in a tunneling oxide layer beneath the polysilicon floating gate layer, a device leaking current is likely generated, and thus the reliability of the device is affected.

To solve the problem of the EEPROM device leaking current, some may substitute the polysilicon with a charge trapping material which, for example, is silicon nitride. Since the silicon nitride is capable of catching electrons and the electrons injected into the silicon nitride layer concentrate in some local region, the defects exist in the tunneling oxide layer become less sensitive. Hence, the device leaking current phenomenon is unlikely occurred. Moreover, commonly there is a silicon oxide layer respectively on top of and beneath the silicon nitride layer to form an oxide-nitride-oxide (ONO) composite layer.

On the other hand, to avoid data reading error due to over-erase/write while erase or write operation is performed to the typical EEPROM, a select transistor is connected on one side of the floating gate and the control gate, so that a two-transistor (2T) structure is formed. The memory programming and reading are controlled via the select transistor.

However, during the operation of the memory unit array of non-volatile memory unit with the 2T structure, under different biases, the problems that memory unit is mis-written or mis-erased because of programming disturbance (program disturbs) or erase disturbance (erase disturbs) may happen; these problems may lead to a lower reliability of the memory units.

SUMMARY OF THE INVENTION

The object of the present invention is to provide a non-volatile memory array which can reduce the program disturbs or erase disturbs phenomena so to improve the memory unit reliability.

The present invention provides a non-volatile memory array which includes a plurality of memory units, a plurality of source lines, a plurality of bit lines, a plurality of word lines and a plurality of control lines. A plurality of memory units is arranged in a row/column array. Each of the memory units includes a first conductive type well region, a second conductive type source region, a second conductive type doped region and a second conductive type drain region, a select gate, a control gate and a charge storage structure. The control gate and the select gate are formed of the same gate material. The charge storage structure includes at least a charge storage layer. The first conductive type well region is disposed in the substrate. The second conductive type source region, the second conductive type doped region and the second conductive type drain region are disposed in the first conductive type well region. The select gate is disposed on the substrate between the second conductive type source region and the second conductive type doped region. The control gate is disposed on the substrate between the second conductive type doped region and the second conductive type drain region. The charge storage structure is disposed between the control gate and the substrate. In the memory units in the same row, two adjacent memory units are disposed in a mirror symmetric manner. A plurality of source lines is arranged in parallel in column direction to connect the second conductive type source regions of the memory units in the same column. A plurality of the bit lines is arranged in parallel in row direction to connect the second conductive type drain regions of the memory units in the same row. A plurality of the word lines is arranged in parallel in column direction to connect the select gates of the memory units in the same column. A plurality of the control lines is arranged in parallel in column direction to connect the control gates of the memory units in the same column. Wherein, every n (n is a positive integer greater than or equal to 2) control lines are grouped into one group, and are electrically connected to each other.

In the above non-volatile memory array, the first conductive type is N type and the second conductive type is P type.

In the above non-volatile memory array, a gate dielectric layer disposed between the select gate and the substrate is further included. The material of the select gate dielectric layer includes silicon oxide layer.

In the above non-volatile memory array, the charge storage structure further includes a tunneling dielectric layer disposed between the charge storage layer and the substrate. The material of the tunneling dielectric layer includes silicon oxide.

In the above non-volatile memory array, the charge storage structure further includes an inter-gate dielectric layer disposed between the charge storage layer and the control gate. The material of the inter-gate dielectric layer includes silicon oxide.

In the above non-volatile memory array, the material of the charge storage layer includes SiN, $Si_xO_yN_z$, nano-crystal layer or doped polysilicon.

In the above non-volatile memory array, in the memory units of the same row, the two adjacent memory units share the source region.

In the above non-volatile memory array, in the memory units of the same row, the two adjacent memory units share the drain region.

In the non-volatile memory array of the present invention, when a channel hot carrier injection mechanism is used to perform programming, a high voltage must be applied to the bit lines of a selected memory unit. Since the bit lines of the same row are connected to each other, therefore, all the memory units of the same row may subject to the program disturbs. According to the present invention, the control lines are connected to each other at a specified number, therefore when perform programming operation to the selected memory unit, only apply the bias on the selected control line groups connecting to the selected memory units to enable the programming; other non-selected control line groups are applied with other bias which will not cause program disturbs. Therefore, during the programming process, the times of the program disturbs affecting the other non-selected memory units can be reduced, and thus the affect of program disturbs is eliminated.

In addition, when perform decoding operation to the memory arrays, the memory units connected by the selected control line groups can be decoded by simply applying a bias to the selected control line groups. Therefore, the decoding operation is simplified, and the types of the biases applied are simplified as well.

In addition, when perform the erase operation to the memory arrays, simply apply a bias to the selected control line groups, while the other non-selected control line groups are not applied with the bias, thus the phenomenon of a soft erase to the memory units of the other groups can be avoided.

The present invention provides a non-volatile memory array which includes a plurality of memory units, a plurality of source lines, a plurality of bit lines, a plurality of word lines and a plurality of control lines. A plurality of memory units are arranged in the row/column array. Each of the memory units includes a first conductive type well region, a second conductive type source region, a second conductive type doped region, a second conductive type drain region, a select gate, a control gate and a charge storage structure. The control gates and the select gates are formed with the same gate material. The charge storage structure includes at least a charge storage layer. The first conductive type well region is disposed in the substrate. The second conductive type source region, the second conductive type doped region and the second conductive type drain region are disposed in the first conductive type well region. The select gate is disposed on the substrate between the second conductive type source region and the second conductive type doped region. The control gate is disposed on the substrate between the second conductive type doped region and the second conductive type drain region. The charge storage structure is disposed between the control gate and the substrate. In the memory units in the same row, two adjacent memory units are disposed in a mirror symmetric method. A plurality of source lines is arranged in parallel in the column direction to connect the second conductive type source regions of the memory units in the same column. And the source lines are connected to the first conductive type well region. A plurality of the bit lines is arranged in parallel in the row direction to connect the second conductive type drain regions of the memory units in the same row. A plurality of the word lines is arranged in parallel in the column direction to connect the select gates of the memory units in the same column. A plurality of the control lines is arranged in parallel in the column direction to connect the control gates of the memory units in the same column.

In the above non-volatile memory array, the first conductive type is N type and the second conductive type is P type.

In the above non-volatile memory array, a select gate dielectric layer disposed between the select gate and the substrate is further included, and the material of the select gate dielectric layer includes silicon oxide layer.

In the above non-volatile memory array, the charge storage structure further includes a tunneling dielectric layer disposed between the charge storage layer and the substrate. The material of the tunneling dielectric layer includes silicon oxide.

In the above non-volatile memory array, the charge storage structure further includes an inter-gate dielectric layer disposed between the charge storage layer and the substrate. The material of the inter-gate dielectric layer includes silicon oxide.

In the above non-volatile memory array, the material of the charge storage layer includes SiN, SixOyNz, nano-crystal layer or doped polysilicon.

In the above non-volatile memory array, in the memory units of the same row, the adjacent two memory units share the source region.

In the above non-volatile memory array, in the memory units of the same row, the adjacent two memory units share the drain region.

In the above non-volatile memory array, since all of the source lines are connected to the first conductive type well region, therefore an electric potential of the first conductive type well region in the memory unit may be evenly distributed via the source lines with network shape. Accordingly, the colony characteristic performance of the memory devices will be greatly improved.

These and other exemplary embodiments, features, aspects, and advantages of the present invention will be described and become more apparent from the detailed description of exemplary embodiments when read in conjunction with accompanying drawings.

DESCRIPTION OF EMBODIMENTS

Figure 1A:
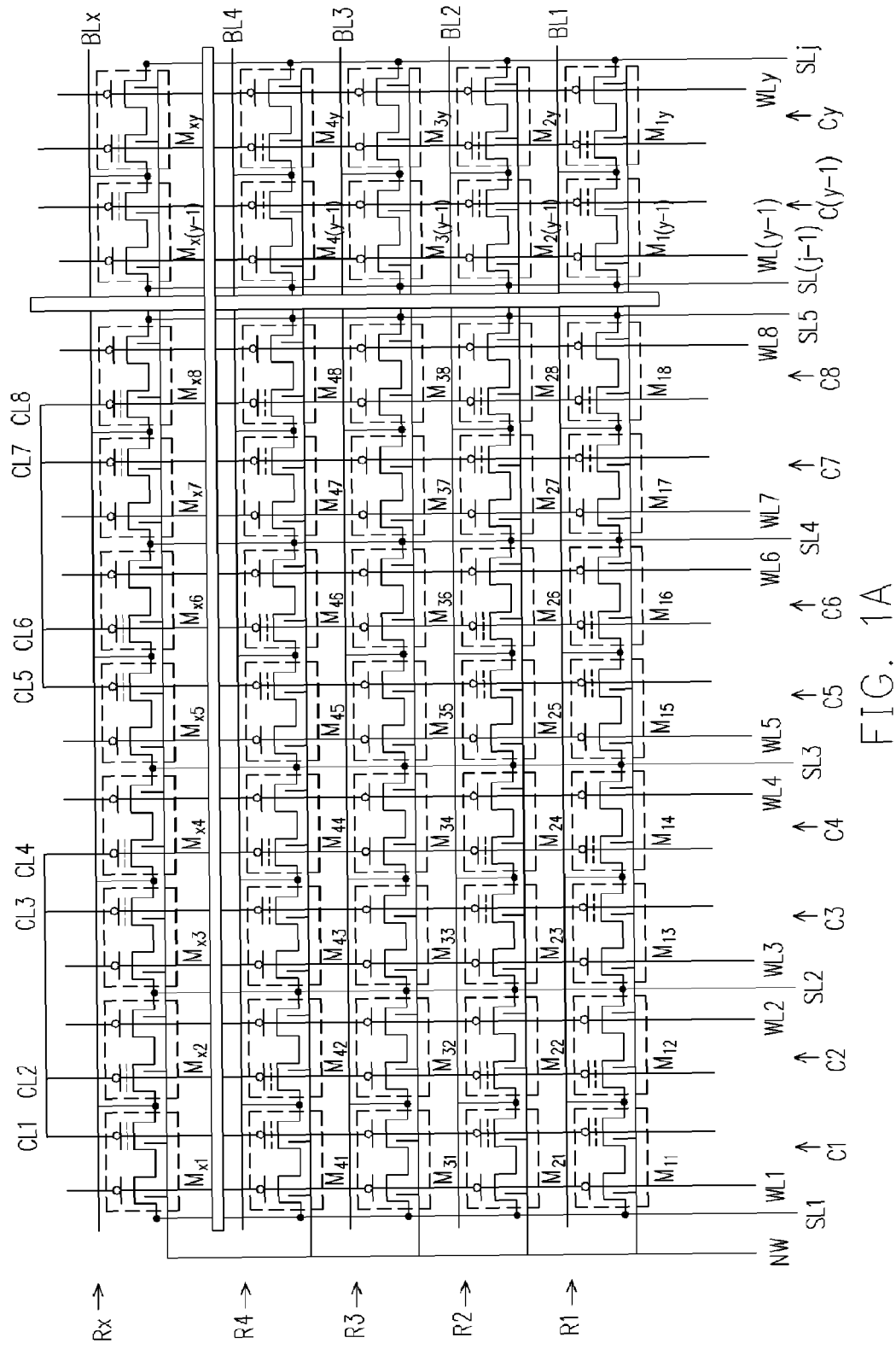
FIG. 1A is a schematic circuit diagram of the non-volatile memory array according to a preferred embodiment of the present invention.
Figure 1B:
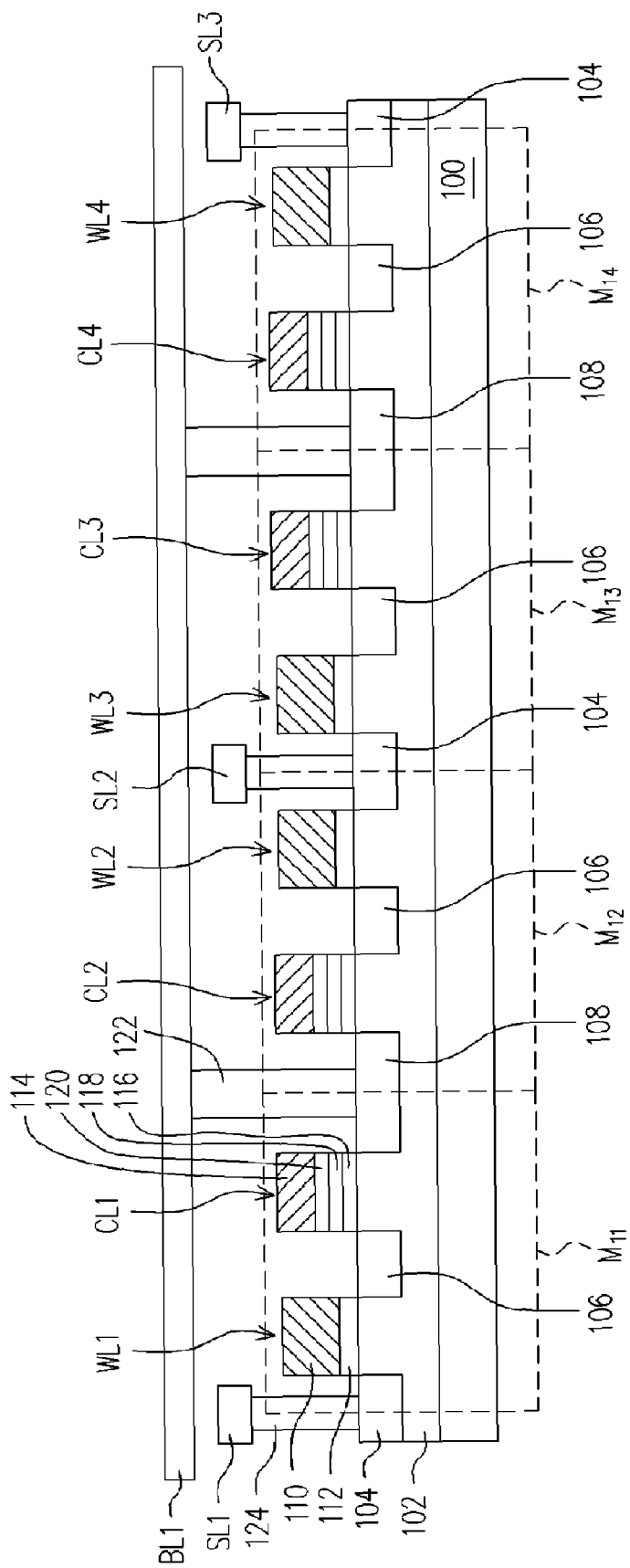
FIG. 1B is a structural section view of the non-volatile memory unit according to a preferred embodiment of the present invention.

FIG. 1A is a schematic circuit diagram of the non-volatile memory array according to a preferred embodiment of the present invention. FIG. 1B is a structural section view of the non-volatile memory unit according to a preferred embodiment of the present invention. FIG. 1B schematically illustrates the section view of the memory units M11~M14 in FIG. 1A.

Firstly, the structure of the memory unit of the present invention is described. With reference to FIG. 1B, the memory unit of the present invention includes a substrate 100, an N type well region 102, a P type source region 104, a P type doped region 106, a P type drain region 108, a select gate 110, a select gate dielectric layer 112, a control gate 114, a tunneling dielectric layer 116, a charge storage layer 118, and an inter-gate dielectric layer 120.

The substrate 100, for example, is a silicon substrate. The N type well region 102, for example, is disposed in the substrate 100.

The P type source region 104, the P type doped region 106 and the P type drain region 108, for example, are disposed in the substrate 100.

The select gate 110, for example, is disposed between the P type source region 104 and the P type doped region 106. The material of the select gate 110, for example, is doped polysilicon. The select gate dielectric layer 112, for example, is disposed between the select gate 110 and the substrate 100. The material of the select gate dielectric layer 112, for example, is silicon oxide.

The control gate 114, for example, is disposed between the P type doped region 106 and the P type drain region 108. The material of the control gate 114, for example, is doped polysilicon. The control gate 114 and the select gate 110, for example, are manufactured in a same gate fabricating process, thus the manufacturing cost can be reduced.

The charge storage structure from the bottom to the top includes the tunneling dielectric layer 116, the charge storage layer 118 and the inter-gate dielectric layer 120. The charge storage layer 118, for example, is disposed between the control gate 114 and the substrate 100. The material of the charge storage layer 118, for example, is conductive material (for example, doped polysilicon) or charge trapping material (for example, silicon nitride, $SixOyNz$, nano-crystal layer), etc.

The tunneling dielectric layer 116, for example, is disposed between the charge storage layer 118 and the substrate 100. The material of the tunneling dielectric layer 116, for example, is silicon oxide.

The inter-gate dielectric layer 120, for example, is disposed between the charge storage layer 118 and the control gate 114. The material of the inter-gate dielectric layer 120, for example, is silicon oxide.

The drain region 108, for example, is electrically connected to the bit line BL1 through a plug 122. The source region 104 is electrically connected to the corresponding source lines SL1~SL3 respectively through the plug 124.

Next, the non-volatile memory array of the present invention is described. With reference to FIG. 1A, the non-volatile memory array of the present invention includes a plurality of memory units M11~Mxy, a plurality of word lines WL1~WLy, a plurality of control lines CL1~CLy, a plurality of bit lines BL1~BLx, a plurality of source lines SL1~SLj and an N type well region NW.

The memory units M1~Mxy are arranged in a row/column array. In the row direction, the memory units M11, M12, . . . , M1y are connected in series to form a memory unit row R1. And the memory units M21, M22, . . . , M2y are connected in series to form a memory unit row R2. With the same principle, the memory units Mx1, Mx2, . . . , Mxy are connected in series to form a memory unit row Rx.

In the column direction, the memory units M11, M12, . . . , Mx1 are arranged to form a memory unit column C1. The memory units M12, M22, . . . , Mx2 are arranged to form a memory unit column C2. In the same principle, the M1y, M2y, . . . , Mxy are arranged to form a memory unit column Cy.

In the memory units row R1~Rx, two adjacent memory units are disposed in a mirror symmetric manner, and the two adjacent memory units may share the source region or drain region. For example, in the memory unit row R1, the memory unit M11 and the memory unit M12 are disposed in the mirror symmetric manner and share the drain region. The memory units M12 and the memory unit M13 are disposed in the mirror symmetric manner and share the source region. With the same principle, the memory unit M1(y−1) and the memory unit M1y are disposed in the mirror symmetric manner and share the drain region.

The N well region NW, for example, is disposed in the substrate beneath the memory units M11~Mxy.

The bit lines BL1~BLx, for example, are arranged in parallel in the row direction to connect the drain regions of the memory units in the same row. For example, the bit line BL1 is connected to the drain region of the memory units M11~M1y in the memory unit row R1. The bit line BL2 is connected to the drain region of the memory units M21~M2y in the memory unit row R2. With the same principle, the bit line BLx is connected to the drain region of the memory units Mx1~Mxy in the memory unit row Rx.

The source lines SL1~SLj, for example, are arranged in parallel in the column direction to connect the source regions of the memory units in the same column. And two adjacent memory cells share a source line. For example, the source line SL1 is connected to the source region of the memory units M11~Mx1 in the memory unit column C1. The source line SL2 is connected to the source region of the memory units M12~Mx2 in the memory unit column C2 and the source region of the memory units M13~Mx3 in the memory unit column C3. The source line SL3 is connected to the source region of the memory units M14~Mx4 in the memory unit column C4 and the source region of the memory units M15~Mx5 in the memory unit column C5. With the same principle, the source line SLj is connected to the source region of the memory units M1y~Mxy in the memory unit column Cy.

The word lines WL1~WLy, for example, are arranged in parallel in the column direction to connect the select gate of the memory units in the same column. For example, the word line WL1 is connected to the select gate of the memory units M11~Mx1 in the memory unit column C1. The word line WL2 is connected to the select gate of the memory units M12~Mx2 in the memory unit column C2. With the same principle, the word line WLj is connected to the select gate of the memory units M1y~Mxy in the memory units column Cy.

The control lines CL1~CLy, for example, are arranged in parallel in column direction to connect the control gate of the memory units in the same column. For example, the control line CL1 is connected to the control gate of the memory units M11~Mx1 in the memory unit column C1. The control line CL2 is connected to the control gate of the memory units M12~Mx2 in the memory unit column C2. With the same principle, the control line CLj is connected to the control gate of the memory units M1y~Mxy in the memory unit column Cy. The control lines CL1~CLy are grouped with every n control lines (n is a positive integer which is greater or equal to 2) in one group, and are electrically connected to each other. For example, in the present invention, 4 control lines are in one group and the control lines CL1~CL4 are electrically connected to each other. The control lines CL5~CL8 are electrically connected to each other.

Of course, in the present invention, the number of the control lines which are electrically connected can be determined based on the practical requirement. For example, the memory unit array may include 32, 64, 128 or 256 memory units. Therefore, the memory unit array may have 32, 64, 128 or 256 control lines. And these control lines are grouped into groups with every n control lines (n is a positive integer which is greater or equal to 2) in one group, for example, every 2, 4, 8, 16 or 32 control lines are in one group, and each group of the control lines is electrically connected to each other.

In addition, the number n (n is a positive integer which is greater or equal to 2) of the control lines which are electrically connected to each other can be determined by the affect caused by programming operation, decoding operation and erasing operation. For example, during the programming operation, the less control lines electrically connected to each other, the more program disturbs to other selected memory units can be avoided. However, during the erasing operation, the more control lines electrically connected to each other, the more simplified the decoding operation and the erasing operation can be, and the simpler the types of biases are. Therefore, the optimal number of control lines electrically connected to each other can be determined by the considerations to the programming operation, the decoding operation and the erasing operation.

In the present invention, since the control lines are connected to each other at a specific number, thus the operation can be simplified. For example, as shown in FIG. 1A, the control lines CL1 to CL4 are electrically connected; and the control lines CL5 to CL8 are electrically connected. When the selected memory units to which the control lines CL1 to CL4 (the selected control line group) are connected to be programmed, simply apply the bias to the control lines CL1 to CL4, and other non-selected control line groups (for example the control lines CL5 to CL8) are applied with another bias which will not cause program disturbs. Thus, the program disturbs to other groups of the memory units can be avoided.

For example, in the beginning, the non-volatile memory array including 256 memory units is designed, the minimum array region is considered. To implement the minimum region, the control lines (CL1~CL256) of 256 memory unit columns have to be electrically connected to each other. However, in this way, the worst situation is that the non-selected memory units (for example, the memory unit M35) may have 255 times of program disturbs (programming M31~M3y, y=256, except for M35) during the programming process. But if the control lines of the 256 memory unit columns are grouped into 64 groups, every 4 control lines are electrically connected (for example, control lines M35, M36, M37 and M38 are electrically connected), then the M35 program disturbs observed are reduced to 3 times, therefore the operation characteristic of the non-volatile memories is greatly improved.

In addition, when perform decoding to the memory arrays, simply apply the bias to the control lines CL1 to CL4 (the selected control line group), the memory units to which the control lines CL1 to CL4 are connected can then be decoded. Therefore, the decoding operation is simplified, the types of the biases become simpler, and the decoding circuit saves more area.

In addition, when the erasing operation to the memory arrays is performed, simply apply the bias to the control lines CL1 to CL4 (the selected control line group), while the other non-selected control lines groups (for example, the control lines CL5 to CL8) are not applied with the bias. Therefore, the soft erase phenomena of other groups of memory units can be avoided.

Figure 1C:
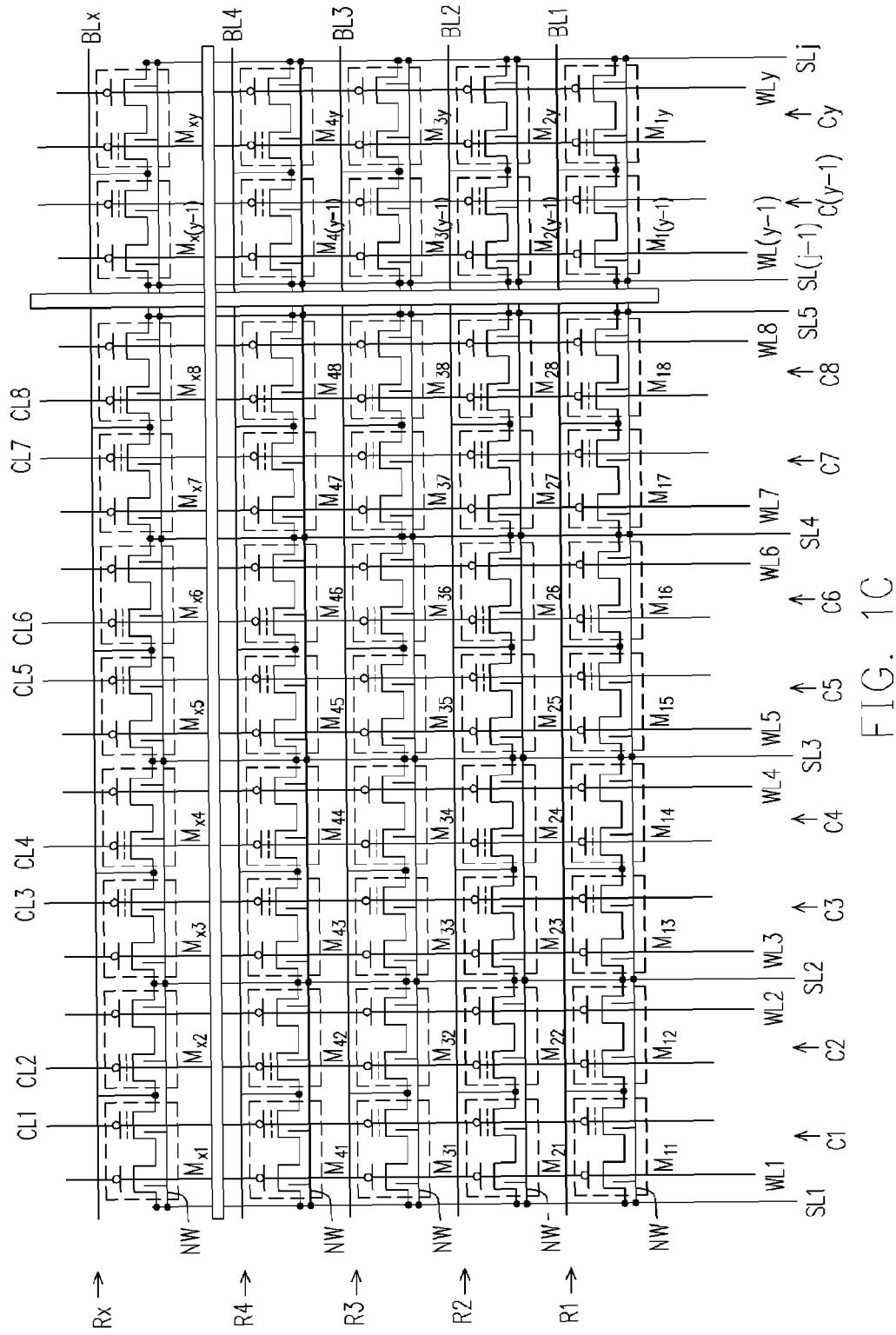
FIG. 1C is a schematic circuit diagram of the non-volatile memory array according to another embodiment of the present invention.

Another improvement aspect of the present invention is that, as shown in FIG. 1C, all the source lines (SL1~SLj) are electrically connected to the N well region NW. Normally, the N well region NW is connected outwardly only around the memory array by N well region, the NW electric potential observed in all of the memory units in the memory array might not be even. Especially in the operation mode requiring a large amount of current, the NW electric potentials in the outskirt of the array and in the central memory unit may be quite different. Usually the source lines may connect the entire array region through aligning a salicided active area automatically and through the upper layer metal wires used as a network. If the N well region is electrically connected to all of the source lines (SL1~SLj), then the N well region electric potential in the memory units may be evenly distributed through all the source lines with network structure. Accordingly, the colony characteristic performance of the memory devices will be greatly improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory array, comprising:
a plurality of memory units arranged in a row/column array, and each of the memory units comprising:
a first conductive type well region disposed in a substrate;
a second conductive type source region, a second conductive type doped region and a second conductive type drain region disposed in the first conductive type well region;
a select gate, disposed on the substrate between the second conductive type source region and the second conductive type doped region;
a control gate, disposed on the substrate between the second conductive type doped region and the second conductive type drain region, wherein the select gate and the control gate are formed of same layer gate material; and
a charge storage structure, wherein the charge storage structure comprises at least a charge storage layer disposed between the control gate and the substrate, and in the memory units of the same row, two adjacent memory units are arranged in a mirror symmetric manner;
a plurality of source lines disposed in parallel in a column direction, connecting to the second conductive type source regions of the memory units of the same column;
a plurality of bit lines disposed in parallel in a row direction, connecting to the second conductive type drain regions of the memory units of the same row;
a plurality of word lines disposed in parallel in the column direction, connecting to the select gates of the memory units of the same column;
a plurality of control lines disposed in parallel in the column direction, connecting to the control gates of the memory units of the same column, wherein the control lines are grouped with every n control lines in one group (n is a positive integer which is greater or equal to 2), and are electrically connected to each other.

2. The non-volatile memory array as claimed in claim 1, wherein the first conductive type is N type.

3. The non-volatile memory array as claimed in claim 1, wherein the second conductive type is P type.

4. The non-volatile memory array as claimed in claim 1, further comprising a select gate dielectric layer disposed between the select gate and the substrate.

5. The non-volatile memory array as claimed in claim 1, wherein the charge storage structure further comprises a tunneling dielectric layer disposed between the charge storage layer and the substrate.

6. The non-volatile memory array as claimed in claim 5, wherein the material of the tunneling dielectric layer comprises silicon oxide.

7. The non-volatile memory array as claimed in claim 1, wherein the charge storage structure further comprises an inter-gate dielectric layer disposed between the charge storage layer and the control gate.

8. The non-volatile memory array as claimed in claim 7, wherein the material of the inter-gate dielectric layer comprises silicon oxide.

9. The non-volatile memory array as claimed in claim 1, wherein the material of the charge storage layer comprises SiN, SixOyNz or nano-crystal layer.

10. The non-volatile memory array as claimed in claim 1, wherein the material of the charge storage layer comprises doped polysilicon.

11. The non-volatile memory array as claimed in claim 1, wherein in the memory units of the same row, the two adjacent memory units share the source region.

12. The non-volatile memory array as claimed in claim 1, wherein in the memory units of the same row, the two adjacent memory units share the drain region.

13. A non-volatile memory array, comprising:
 a plurality of memory units arranged in a row/column array, and each of the memory units comprising:
  a first conductive type well region disposed in a substrate;
  a second conductive type source region, a second conductive type doped region and a second conductive type drain region disposed in the first conductive type well region;
  a select gate, disposed on the substrate between the second conductive type source region and the second conductive type doped region;
  a control gate, disposed on the substrate between the second conductive type doped region and the second conductive type drain region, wherein the control gate and the select gate are formed with same layer gate material; and
  a charge storage structure, wherein the charge storage structure comprises at least a charge storage layer disposed between the control gate and the substrate, and in the memory units of the same row, two adjacent memory units are arranged in a mirror symmetric manner;
 a plurality of source lines disposed in parallel in a column direction, connecting to the second conductive type source regions of the memory units of the same column, and electrically connecting to the first conductive type well region;
 a plurality of bit lines disposed in parallel in a row direction, connecting to the second conductive type drain regions of the memory units of the same row;
 a plurality of word lines disposed in parallel in the column direction, connecting to the select gates of the memory units of the same column;
 a plurality of control lines disposed in parallel in the column direction, connecting to the control gates of the memory units of the same column.

14. The non-volatile memory array as claimed in claim 13, wherein the first conductive type is N type.

15. The non-volatile memory array as claimed in claim 13, wherein the second conductive type is P type.

16. The non-volatile memory array as claimed in claim 13, further comprising a select gate dielectric layer disposed between the select gate and the substrate.

17. The non-volatile memory array as claimed in claim 13, wherein the charge storage structure further comprises a tunneling dielectric layer disposed between the charge storage layer and the substrate.

18. The non-volatile memory array as claimed in claim 17, wherein the material of the tunneling dielectric layer comprises silicon oxide.

19. The non-volatile memory array as claimed in claim 13, wherein the charge storage structure further comprises an inter-gate dielectric layer disposed between the charge storage layer and the control gate.

20. The non-volatile memory array as claimed in claim 19, wherein the material of the inter-gate dielectric layer comprises silicon oxide.

21. The non-volatile memory array as claimed in claim 13, wherein the material of the charge storage layer comprises SiN, SixOyNz or nano-crystal layer.

22. The non-volatile memory array as claimed in claim 13, wherein the material of the charge storage layer comprises doped polysilicon.

23. The non-volatile memory array as claimed in claim 13, wherein in the memory units of the same row, the two adjacent memory units share the source region.

24. The non-volatile memory array as claimed in claim 13, wherein in the memory units of the same row, the two adjacent memory units share the drain region.

* * * * *